(12) United States Patent
Stubhan et al.

(10) Patent No.: US 9,238,584 B2
(45) Date of Patent: Jan. 19, 2016

(54) CLAMPING AND CONTACTING DEVICE FOR THIN SILICON RODS

(75) Inventors: Frank Stubhan, Ehingen (DE); Michael Leck, Oberdischingen (DE)

(73) Assignee: SITEC GmbH, Burghausen (DE)

( * ) Notice: Subject to any disclaimer, the term of this patent is extended or adjusted under 35 U.S.C. 154(b) by 1097 days.

(21) Appl. No.: 13/201,888

(22) PCT Filed: Mar. 29, 2010

(86) PCT No.: PCT/EP2010/001985
§ 371 (c)(1),
(2), (4) Date: Nov. 12, 2011

(87) PCT Pub. No.: WO2010/115542
PCT Pub. Date: Oct. 14, 2010

(65) Prior Publication Data
US 2012/0135635 A1   May 31, 2012

(30) Foreign Application Priority Data

Mar. 31, 2009  (DE) .................. 20 2009 017 768 U
Feb. 18, 2010  (DE) .................. 20 2010 002 486 U

(51) Int. Cl.
*C01B 33/035* (2006.01)
*C23C 16/24* (2006.01)
*C30B 13/28* (2006.01)

(52) U.S. Cl.
CPC ............... *C01B 33/035* (2013.01); *C23C 16/24* (2013.01); *C30B 13/285* (2013.01)

(58) Field of Classification Search
CPC combination set(s) only.
See application file for complete search history.

(56) References Cited

U.S. PATENT DOCUMENTS

| | | | |
|---|---|---|---|
| 1,569,651 A | 1/1926 | Costello | |
| 3,191,924 A * | 6/1965 | Haus | 117/219 |
| 3,647,530 A | 3/1972 | Dyer | |
| 4,141,764 A | 2/1979 | Authier et al. | |
| 5,427,057 A * | 6/1995 | Hattori et al. | 117/220 |
| 6,221,155 B1 | 4/2001 | Keck et al. | |
| 2010/0229796 A1 * | 9/2010 | Endoh et al. | 118/728 |

FOREIGN PATENT DOCUMENTS

| | | |
|---|---|---|
| CN | 101405437 | 4/2009 |
| FR | 2392137 | 11/1977 |
| WO | 2007/133025 | 11/2007 |
| WO | 2007136209 | 11/2007 |

* cited by examiner

*Primary Examiner* — Duy Deo
*Assistant Examiner* — Erin Bergner
(74) *Attorney, Agent, or Firm* — Tarolli, Sundheim, Covell & Tummino LLP

(57) ABSTRACT

A clamping and contacting device for mounting and electrically contacting thin silicon rods in silicon deposition reactors is disclosed, the clamping and contacting device having a rod holder for receiving one end of a thin silicon rod. The rod holder comprises at least three contact elements disposed around a receiving space for the thin silicon rod. Each of the contact elements forms a contact surface facing towards a receiving space for electrically and mechanically contacts the thin silicon rod, wherein the contact surfaces of adjacent contact elements are spaced apart.

19 Claims, 4 Drawing Sheets

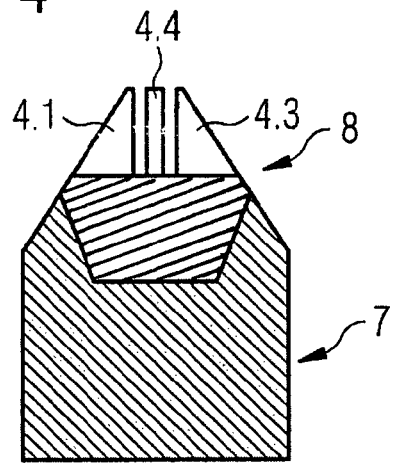
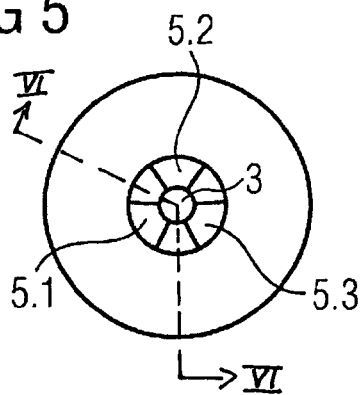
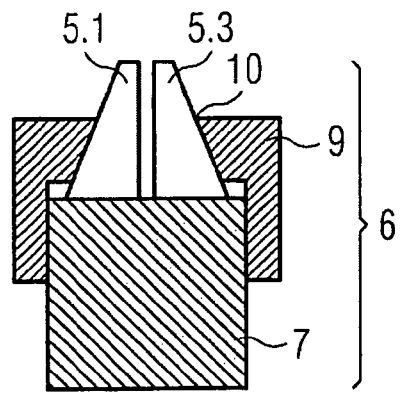

CLAMPING AND CONTACTING DEVICE FOR THIN SILICON RODS

RELATED APPLICATION

This application corresponds to PCT/EP2010/001985, filed Mar. 29, 2010, which claims the benefit of German Applications Nos. 20 2009 017 768.8, filed Mar. 31, 2009 and 20 2010 002 486.2, filed Feb. 18, 2010, the subject matter, of which is incorporated herein by reference in its entirety.

The invention relates to a clamping and contacting device for mounting and electrically contacting thin silicon rods in silicon deposition reactors comprising a rod holder generally consisting of graphite for receiving a respective end of a thin silicon rod.

It is known in semiconductor and photovoltaic technology to produce high purity silicon rods for example according to the Siemens method in vapor deposition reactors, especially in chemical vapor deposition reactors. For this, thin silicon rods are first received in the reactors, and thereafter, during the deposition process, silicon is deposited thereon. Generally the thin silicon rods are received by means of clamping and contacting devices, on the one hand receiving them in a desired orientation and on the other hand providing electrical contact. The electrical contact is required since, during the deposition process, electrical current having a predefined voltage is employed to heat the thin silicon rods by means of resistance heating to a temperature at which the deposition of silicon from a vapor or gas phase on the thin silicon rods may take place. The deposition temperature is at 900 to 1340° C. and typically at 1100 to 1200° C. The temperature should not exceed the upper value since this would involve the risk of the thin silicon rod breaking or melting.

If this happens, the deposition generally has to be terminated, and the silicon deposition reactor has to be opened after sufficient cooling-down to replace the damaged thin silicon rods by new thin silicon rods. This may consume a large amount of time since the silicon deposition reactor first needs to cool down, and an exchange of gas has to take place before it may be opened, thus causing a considerable loss of production. Furthermore this causes a loss of material.

DE 1 187 098 A describes an apparatus and method for producing silicon rods of the above mentioned type. The apparatus employed for performing the method mainly consists of a reaction vessel made of glass or quartz in which two thin silicon rods are free-standingly received in rod holders made of pure carbon or graphite. At their respective free upper ends the thin silicon rods are connected to each other via a current conductive bridge of silicon or pure carbon so as to form a current circuit via the respective rod holders, the thin silicon rods and the bridge and so as to facilitate the resistance heating described above.

The reaction vessel is enclosed by a reflector cylinder and alternatively by additional heating resistors. When the thin silicon rods are received in the reactor, they are heated to a deposition temperature by the resistance heating described above and by optional additional heating elements. After reaching a deposition temperature, a mixture of silicon-containing gas such as silicon tetrachloride or trichlorosilane and another gas, such as hydrogen is introduced into the reaction vessel. Alternatively monosilane or silicon iodide may be employed as a silicon-containing gas.

In more recent facilities for coating thin silicon rods, often far more than two thin silicon rods are disposed next to each other and coated simultaneously. In this case, always two adjacent thin silicon rods are connected to each other by a current conductive bridge and are connected to a current supply by the rod holders at the base end.

When electrically heating the thin silicon rods using resistance heating, it has to be paid attention to not exceeding the predefined temperature, in particular when heating the thin silicon rods to the deposition temperature and also during the first hours of the deposition process. However, here the rod holders may cause problems.

The rod holders, mostly consisting of graphite, often comprise a conically tapered receiving space having the form of a blind bore, into which the thin silicon rods are inserted from above. This leads to a tapered connection between the rod holder and the thin silicon rod. The inserted thin silicon rods typically exhibit a circular or square cross-section having a diameter of 6 to 10 mm. The tapering of the receiving space has to be implemented with high precision, so as to provide sufficient mechanical and electrical contact between the rod holder and the thin silicon rod, causing high manufacturing costs.

The rod holders may have a slit in the area of the blind bore so as to allow for a certain tolerance compensation and to reduce mechanical stress, within certain limits, when heating.

In particular, the electric contacting of the silicon rods by the rod holder is critical. When the thin silicon rods comprise a square cross-section, the electrical and mechanical contact is made along the edges. Thus the contact surface is extremely small and the mechanical strain on edges may easily lead to damages. Moreover along the edges a high electrical contact resistance arises. However, with thin silicon rods having a circular cross-section, the electric and mechanic contact is made along a circumferential line along the complete circumference of the thin silicon rod.

Particularly at the beginning of the heating process, contact heat areas arise at the contact point of graphite and silicon possibly causing melting or breaking of the thin silicon rods due to mechanical stress. This would lead to the undesired consequences described above, i.e. interrupting the process and newly matching the silicon deposition reactor in a complex procedure.

In particular the thin silicon rods break, when the contact heat area becomes very large, i.e. exceeding about ¼ of the rod's diameter, or when the contact heat is located along the complete circumference of a circular thin silicon rod.

The problem to be solved by the invention is to provide a clamping and contacting device for thin silicon rods that avoids one or several of the above stated problems.

The problem to be solved by the invention is solved by a clamping and contacting device according to claim 1. Further embodiments of the invention may be derived from the dependent claims.

In particular a clamping and contacting device is provided for mounting and electrically contacting thin silicon rods in silicon deposition reactors having a rod holder for receiving one end of a thin silicon rod, wherein the rod holder comprises at least three contact elements disposed around a receiving space for the thin silicon rod, and each of the contact elements forming a contact surface facing the receiving space for electrically and mechanically contacting the thin silicon rod, wherein the contact surfaces of adjacent contact elements are spaced from each other.

This creates a defined number of electric and mechanic contact surface at the rod holder for the thin silicon rod which may be matched to the shape of the thin silicon rods. The distance between the contact surfaces prevents "travelling" of possibly existing contact heat areas, thus permitting a reduction of the risk of melting or breaking the thin silicon rod.

Via the defined contact surfaces, substantially larger currents may be set compared to using the known tapered connection, thus allowing to reach a higher temperature and in particular faster temperature rise for the thin silicon rod. Furthermore, the material gets hotter due to the smaller cross sectional area of the graphite, resulting in an intense mechanically resistant connection between graphite and silicon.

The contact surfaces may extend in parallel to the longitudinal axis of the rod holder which may correspond to the longitudinal axis of the thin silicon rod in order to permit contacting preferably over a substantial area. For this end, the contact surfaces may be stripe-shaped and may particularly be matched to the contour of the thin silicon rod. In this context, stripe-shaped is to be understood as the contact surfaces comprising a width essentially smaller than the circumference of the thin silicon rod, wherein the sum of the widths of all contact surfaces is smaller than the circumference of the thin silicon rod. The sum of the widths of all contact surfaces may be smaller than or roughly equal to half the circumference of the thin silicon rod.

In one embodiment of the invention, the contact elements may be moved with respect to each other, in particular towards the receiving space. This may permit that one end of the thin silicon rod is first freely received in the receiving space and is then fixedly clamped by the contact surfaces in the receiving space by relative movement of the contact elements towards one another. Thus, the result is good mechanical and electrical contacting of the thin silicon rod in the receiving space.

In one embodiment of the invention, the contact elements form-fittedly and/or force-fittedly contact the thin silicon rod at its lower end.

In another embodiment of the invention, the contact elements force-fittedly touch the thin silicon rod at is lower end.

Advantageously, the rod holder is designed in two pieces consisting of a base element and a clamping element comprising the contact elements. The base element may then be re-used, whereas the clamping element is seen as a lost element, and for each new thin silicon rod a new clamping element is to be used. This is due to the fact that the clamping elements are destroyed by the intense connection with the silicon, since the silicon rod grows into the clamping elements as it becomes continuously thicker during the silicon growth process. The clamping element may be form-fittedly and slightly force-fittedly connected to the base element, as to allow for an easy replacement of clamping elements. The rod holder may, of course, also comprise multiple components, i.e. it may be implemented comprising more than two components.

In one embodiment the base element comprises a tapered receptacle, in particular a conically tapered receptacle and the clamping element comprises a corresponding tapered contour. Such a design permits on the one hand an automatic centering of the elements with respect to each other and on the other hand an easy handling of the clamping element when inserting the clamping element into the recess or taking the clamping element out of the recess. The tapering of the receptacle of the base element and the tapered contour of the clamping element are preferably dimensioned such that a movement of the clamping element into the receptacle causes a movement of the contact elements towards one another, so as to reduce the receiving space. The movement of contact elements towards one another preferably occurs perpendicular to their contact surfaces. By this an automatic clamping of a thin silicon rod received in the receiving space may be achieved when inserting the clamping element into the receptacle. As a result, a wedging effect with high contact pressure may occur, which may lead to a reduction in contact resistance between the contact element and the thin silicon rod. Clamping over a substantial area reduces mechanical strain, thus reducing the risk of a thin silicon rod toppling. It is possible to first loosely insert the clamping element into the receptacle, so that a reduction of receiving space does not yet occur. Then the thin silicon rod may be freely introduced into the receiving space, and only then the clamping element may finally be pushed deeper into the receptacle, so as to cause the clamping of the thin silicon rod. Here it is particularly advantageous that no additional elements are required for generating the clamping, apart from the clamping element and the base element, and thus the construction is simple. Further the mass of elements inserted into the deposition reactor is reduced which facilitates heating to the deposition temperature. Also additional elements may be sources of contamination or could be contaminated during the process to such a degree that they would have to be regularly replaced and/or cleaned.

In order to obtain an sound and defined clamping, it is advantageous if the movement of contact elements takes place perpendicular to their contact surfaces. This may be achieved by a corresponding design of the clamping elements and/or the receptacle. In order to achieve a sound and defined clamping, it is also possible to match the contact surfaces of the contact elements to the contour of the thin silicon rod, so as to contact the thin silicon rod over a substantial area. For example the contact surfaces for circular thin silicon rods may exhibit a curvature in one plane corresponding to the curvature of the thin rods, while the contact surfaces for angular thin rods may exhibit contact surfaces extending over a substantial area.

In one embodiment, the contact elements are disposed at even distances around the receiving space, so as to achieve a symmetric contacting of the thin silicon rod. In a first alternative for thin silicon rods having a square cross-section, the clamping element comprises for example four narrow contact elements having narrow contact surfaces disposed with an offset of 90°. In a second alternative, the clamping element for thin silicon rods having a circular cross-section comprises for example three contact elements having narrow contact surfaces, which are disposed with an offset of 120° with respect to each other, comprising a curvature corresponding to the curvature of the thin silicon rod.

In one specific embodiment, the contact elements are separate elements connected to each other by means of connection elements at least before they are inserted. The separate elements allow for a flexibility which is advantageous with respect to the clamping, while the connection elements facilitate the handling of the contact elements as a single unit before being used. The connection elements between the contact elements may be flexible and/or may comprise predetermined breaking points, so as to permit a relative movement between the contact elements. For a simple construction the contact elements and the connection elements may be integrally formed and may, for example, be machined from a graphite workpiece.

According to one embodiment, a clamping ring is provided which may be attached to the base element in such a manner that a receptacle for the contact elements is formed between the clamping ring and the base element, wherein the receptacle is dimensioned so as to move the contact elements relative to one another and in particular towards the receiving space when the clamping ring is being attached to the base element. Such a clamping ring may improve the stability of the contact elements in the base body if necessary and, if necessary, an increased clamping force for the thin silicon rod may be achieved. The clamping ring may for example be threadably connectable onto the base element or may be clamped to the base element by a quick-release mechanism. Here the clamping ring could for example comprise an aperture having a tapered inner wall adapted to the tapered contour of the contact elements, so as to provide a movement of the contact elements. The clamping ring is not necessarily electrically conductive and should consist of a sufficiently firm and temperature-resistant material.

The clamping and contacting device according to the invention may positively influence the process control in a silicon deposition reactor, since supply of silane vapor or gas may take place already at the beginning of the heating process of the thin silicon rods. Via the contact surfaces high temperatures may be achieved in particular in the areas of the contact surfaces already at the beginning of the heating process with the result of the supplied silane vapor depositing on the hotter areas, which leads to a self-healing of minor damages, if existent, of the thin silicon rod in these areas.

In the following the invention is described in more detail by means of various embodiments with reference to the drawing; in the drawings the following is shown:

FIG. 4 is a diagrammatic sectional view of the rod holder of FIG. 1 taken along line IV-IV in FIG. 1 with the thin silicon rod not shown;

FIG. 5 is a diagrammatic plan view of an alternative rod holder with an inserted thin silicon rod having a circular cross-section designed according to the principles of a drill chuck;

FIG. 6 is a diagrammatic sectional illustration of the rod holder of FIG. 5 taken along line VI-VI in FIG. 5;

The terms top, bottom, right, and left, used in the following specification correspond to the representation in the Figs. and these terms are not to be seen in a limiting manner, although they may refer to a preferred orientation.

Figure 1:
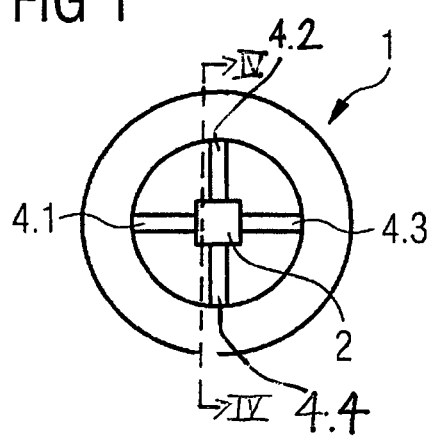
FIG. 1 is a diagrammatic plan view of the rod holder with an inserted thin silicon rod having a square cross-section.
Figure 2:
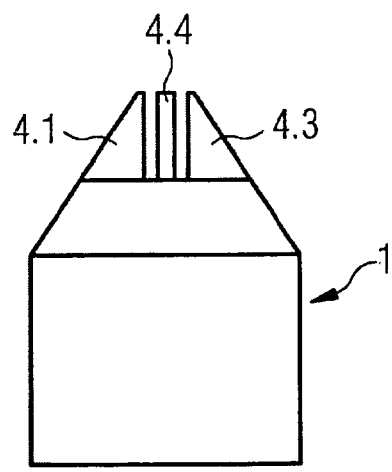
FIG. 2 is a diagrammatic side view of the rod holder of FIG. 1.
Figure 3:
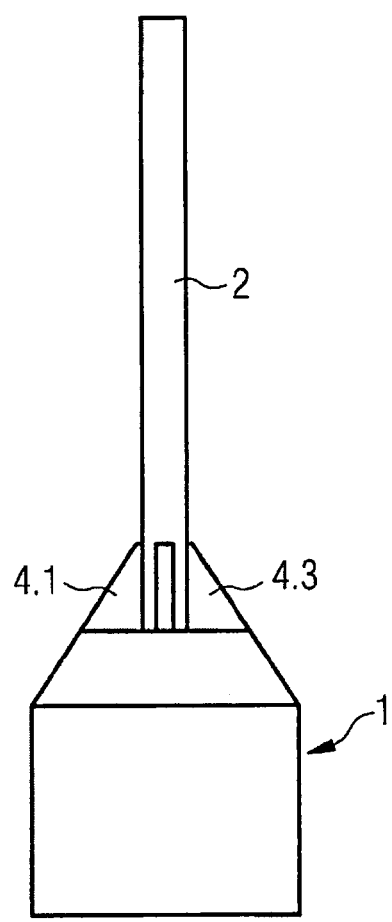
FIG. 3 is a diagrammatic side view of the rod holder of FIG. 2 with an inserted thin silicon rod.

FIG. 1 presents a diagrammatic plan view of a rod holder 1 according to a first embodiment. The rod holder 1 consists e.g. of graphite and is shown with an inserted thin silicon rod 2 having a square cross-section. FIGS. 2 and 3 each show a side view of the rod holder 1 of FIG. 1, wherein FIG. 2 shows the rod holder without inserted thin silicon rod 2 and wherein FIG. 3 shows the rod holder with inserted thin silicon rod 2. FIG. 4 presents a diagrammatic sectional view of the rod holder of FIG. 1 taken along line IV-IV in FIG. 1, wherein the thin silicon rod is not shown for reasons of a simple illustration.

Such a rod holder 1 is used in silicon deposition reactors (not shown) for producing silicon rods having larger diameters and serves the purpose of keeping a thin silicon rod in a essentially free standing position during the deposition process and of electrically contacting the thin silicon rod, as was previously described. Essentially free standing is to be understood as one end portion of the thin silicon rod being received and held in the rod holder, whereas the major portion of the thin silicon rod freely protrudes from the rod holder and is exposed to the process gas atmosphere in the deposition reactor. Rod holders are generally disposed in pairs so as to form electric circuits via the rod holders, the thin silicon rods received therein, and the corresponding electrically conductive connections at the corresponding free end of the thin silicon rods 2. This electric circuit permits resistance heating of thin silicon rods 2 in conjunction with an electric supply, so as to the thin silicon rods 2 to a deposition temperature, as described above.

As may be seen in FIG. 4, the rod holder comprises a base element 7 and a clamping element 8, which are designed as separate components. The clamping element 8 is used for receiving and electrically contacting the thin silicon rod and is for single use due to its contact with the thin silicon rod during the deposition process. The base element 7 is used for receiving and fixing the clamping element 8 and may be used multiple times due to the distance to thin silicon rod 2 during the deposition process.

The base element has a cylindrical basic shape, which is conically formed at an upper end. The conically shaped upper end comprises a recess, which is tapered in downward direction towards a base. The recess extends into the cylindrical portion of the base element.

The clamping element 8 comprises a lower base 3 and four contact elements 4.1, 4.2, 4.3, 4.4 extending from there in an upward direction. The lower surface of base 3 is formed conforming to the recess of base element 7, so as to be matchedly received therein. The upper surface is formed to be planar. Due to the tapering of the recess and the corresponding form of base 3 a self-centering of elements with respect to each takes place when the clamping element 8 is inserted into the base element. The base 3 has a planar upper surface comprising a slanted portion adjacent thereto, wherein the slant corresponds to the slant of the tapering of base element 7.

The contact elements 4.1, 4.2, 4.3, 4.4 extend from the upper surface of base 3, and each of the contact elements has, in side view, generally the shape of a right-angled triangle (FIG. 4). The contact elements are disposed in a way that one cathetus is parallel to the upper surface of base 3, while the other cathetus is perpendicular thereto. The contact elements 4.1, 4.2, 4.3, 4.4 are oriented radially towards a center of the surface and are distanced apart so as to form a receiving space in between. The contact elements 4.1, 4.2, 4.3, 4.4 are disposed at equal angular distances of 90° with respect to each other and their respective catheti perpendicular to the upper surface of the basis point inwards towards the receiving space. The respective hypotenuse of contact elements 4.1, 4.2, 4.3, 4.4 points outwards and forms a slant, wherein the slant is the same as the slant of the tapering of base element 7. The free upper corner of the triangle shape is truncated, as can be seen in FIG. 4, so as to avoid a spike which could easily cause damaging of the contact elements in this area or which could cause a damaging of the thin silicon rod 2.

The contact elements 4.1, 4.2, 4.3, 4.4 form stripe-shaped contact surfaces along their inner surfaces extending in parallel to the longitudinal axis A of the rod holder. The contact surfaces contact a thin silicon rod having a square cross-section received in the receiving space along its edge surfaces in the center of a width of a respective edge surface as can be seen best in FIGS. 1 and 3. The width of the contact surfaces should preferably correspond to a maximum of 50% of the width of a edge surface of a thin silicon rod 2, respectively.

FIG. 5 shows a diagrammatic plan view of an alternative rod holder 6 having a receptacle for a thin silicon rod 3 having a circular cross-section designed according to the principles of a drill chuck. FIG. 6 shows a diagrammatic sectional view of rod holder 6 taken along line VI-VI in FIG. 5. The rod holder 6 and the corresponding thin silicon rod 3 may be inserted into the receptacle in the same manner as described above.

As can be seen best in FIG. 6, the rod holder 6 comprises a base element 7 corresponding to the base element described above and a clamping element 8 corresponding to the clamping element described above. The clamping element 8 is part of a clamping unit (not further identified in the Figs.) comprising a clamping ring 9 besides the clamping element 8. The clamping element 8 is used for electrically and mechanically contacting a thin silicon rod 3 and is for single use due to its contact with the thin silicon rod during the deposition process. The base element 7 is used for receiving and fixing the clamping element 8 and may be used multiple times due to the distance to the thin silicon rod 2 during the deposition process. The clamping ring 9 is used for clamping the clamping element 8 with respect to the base element, as is described below and may be used multiple times due to the distance to thin silicon rod 2 during the deposition process.

The base element 7 comprises a cylindrical basic shape and comprises a generally plane upper surface on which the clamping element 8 may be placed.

The clamping element consists of three contact elements 5.1, 5.2 and 5.3 each of which has, similar to the contact elements described above, if seen in a side view, essentially the shape of a right-angled triangle. Each of the contact elements 5.1, 5.2 and 5.3 is disposed in a way that one cathetus is parallel to the upper surface of the base element 7, while the other cathetus is perpendicular thereto. The contact elements 5.1, 5.2 and 5.3 are oriented radially towards a center of the surface and are spaced so as to form a receiving space in between. The contact elements 5.1, 5.2 and 5.3 are disposed at equal angular distances of 120° with respect to each other, and their respective catheti perpendicular to the upper surface of the basis point inwards towards the receiving space. The respective hypotenuse of the contact elements 5.1, 5.2 and 5.3 points outwards and forms a slant, wherein the slant is the same as the slant of the tapering of the base element 7. The three contact elements 5.1, 5.2 and 5.3 thus delineate parts of a contour of a cone. The free upper corner of the triangle shape is again truncated, as can be seen in FIG. 5.

The contact elements 5.1, 5.2 and 5.3 form stripe-shaped contact surfaces along their inner surfaces extending in parallel to the longitudinal axis A of the rod holder. The contact surfaces have a round shape and match to the form of the circular thin silicon rod 3 so as to provide a good contact to a thin silicon rod 3 received in the receiving space. The contact surfaces contact thin silicon rod 3 on a maximum of 50% of its circumference.

The contact elements 5.1, 5.2 and 5.3 are each separate elements, which may be moved towards each other and which are connected to each other by means of connection elements at least before they are inserted.

The clamping ring 9 is essentially cup-shaped having a base comprising an aperture 10 and a circumferential side all perpendicular to the base. When in use, the clamping ring 9 is employed in reversed orientation, i.e. it is used with its side wall pointing downwards, as can be seen in FIG. 6. The side wall may be provided with fastening means along its inner circumference cooperating with corresponding fastening means on base body 7 so as to mount the clamping ring 9 with respect to the base body. Internal threads on the side wall and external threads on the base body or corresponding elements for a quick-release or bayonet fastener may be considered as an example of fastening means. Other fastening means may as well be provided, of course.

The aperture 10 is formed centrally with the inside wall of aperture 10 having a slant corresponding to the slant of contact elements 5.1, 5.2 and 5.3, which is pointing in an outward direction. As can be seen in FIG. 6, the contact elements 5.1, 5.2 and 5.3 may be partially received between the clamping ring 9 and the base element 7 and may partially extend outwards through central aperture 10 in the clamping ring. Then, the slant of the central aperture engages with the outward pointing slant of the contact elements 5.1, 5.2 and 5.3. The contact elements 5.1, 5.2 and 5.3 may be moved towards each other by means of this engagement, so as to reduce the receiving space for the thin silicon rod 3 formed in between and so as to fixedly clamp the received thin silicon rod 3. FIG. 6 shows how the clamping ring 9 is placed on the contact elements 5 and how the clamping ring 9 is able to press the contact elements 5.1, 5.2 and 5.3 around the lower end of a thin silicon rod 3 (not shown) similar to a drill chuck by a movement in axial direction towards the base element 7. For this purpose the clamping ring 9 may be threadably connectable to the base element 7, as illustrated in FIG. 6, or may be clamped to the base element 7 by means of a quick-release mechanism.

Although three contact elements are shown with this embodiment having a clamping ring, four or more contact elements corresponding to the shape of the thin silicon rod to be inserted may also be used in this alternative. Of course, the alternative without a clamping ring may as well be provided with three contact elements or more than the illustrated four contact elements.

According to the invention, the number of electric and mechanic contact surfaces between the rod holder 1 and the thin silicon rod 2, 3 is minimized by forming four defined contact elements 4.1, 4.2, 4.3, 4.4 on the rod holder 1 (FIG. 1) which are electrically and mechanically connected to the thin silicon rod 2 in a stripe shape in longitudinal orientation, or by forming three contact elements 5.1, 5.2, 5.3 on the rod holder 6 (FIG. 4). The four contact elements 4 are disposed with an offset of 90° each and the three contact elements 5.1, 5.2, 5.3 with an offset of 120° each.

The contact elements 4, 5 touch the thin silicon rod 2, 3 at its lower end in a form-fitted manner as is illustrated in FIGS. 1 and 2, or in a form- and force-fitted manner, as illustrated in FIGS. 4, 5 by forming narrow contact surfaces.

The rod holders 1 may be designed as two pieces and may comprise a base element 7 and a clamping element 8, as illustrated, or may be designed as a single piece.

On the one hand, the invention creates a defined number of narrow electric and mechanic contact surfaces between the thin silicon rod 2, 3 and the rod holder 1, and on the other hand the increased distance between the contact surfaces of the contact elements 4, 5 and the thin silicon rod 2, 3 inhibits "travelling" of the possibly still existing contact heat areas, which are caused by tolerance problems of the contact surfaces.

In particular, contacting along their corners is avoided for thin silicon rods 2 having a square cross-section.

As a result, substantially larger currents may be set, creating a higher temperature of the thin silicon rods 2, 3 and facilitating faster heating. Furthermore, the material gets hotter due to the smaller diameter of the graphite, i.e. due to the defined narrow contact surfaces, resulting in a more intense mechanically resilient connection between graphite and silicon.

The clamping and contacting device according to the invention may be advantageously used in a deposition reactor when silane vapor and steam are introduced simultaneously already at the beginning of the heating process of the thin silicon rods 2, 3.

This is possible due to the higher temperatures of the contact surfaces between the rod holder 1 and the thin silicon rod 2, 3 already at the beginning of the heating process, with the result of the introduced silane vapor or gas depositing on the hotter areas, which leads to self-healing of thin silicon rods 2, 3. This results in an increased stability.

Figure 7:
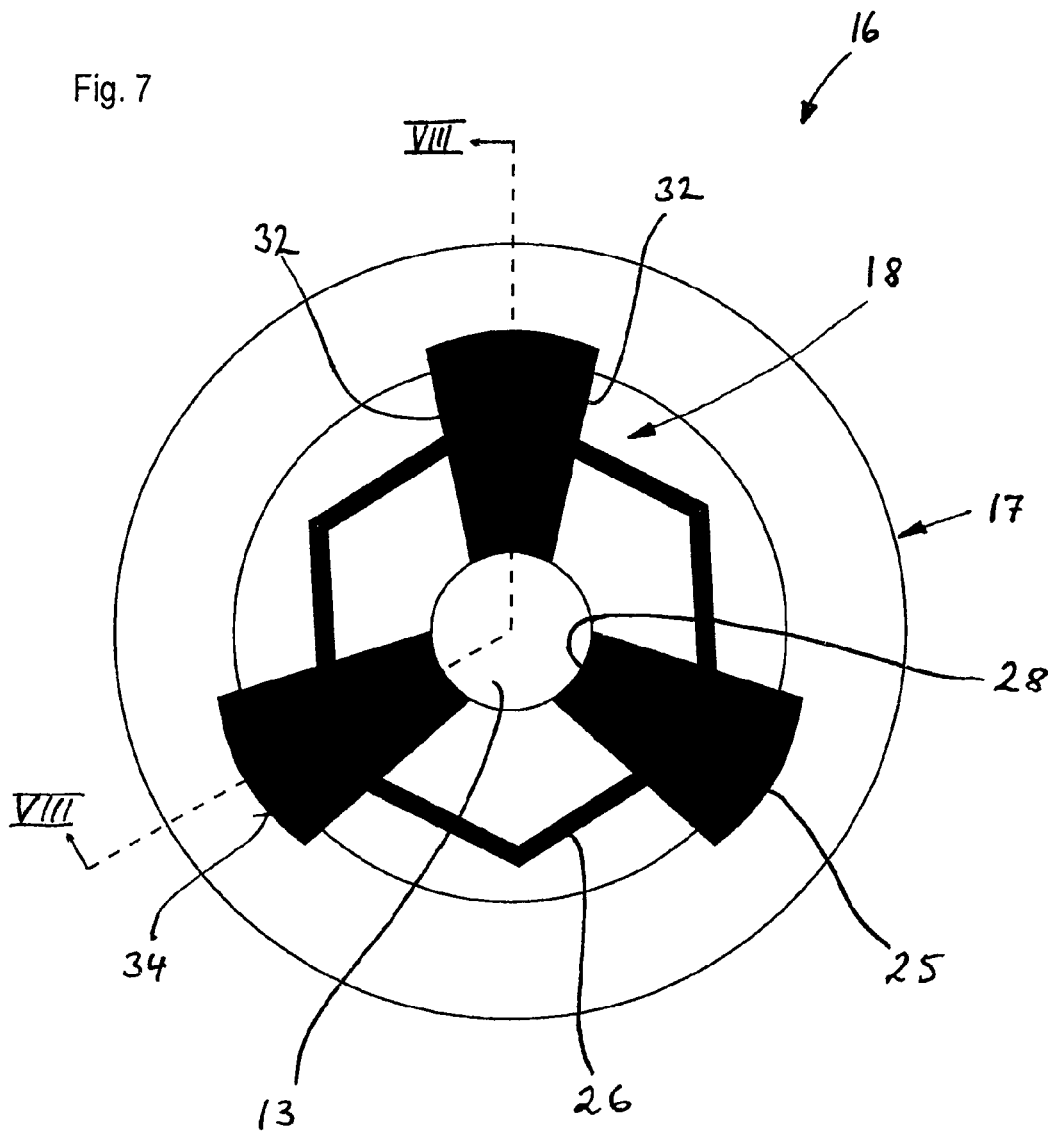
FIG. 7 is a diagrammatic plan view of a rod holder according to another alternative.
Figure 8:
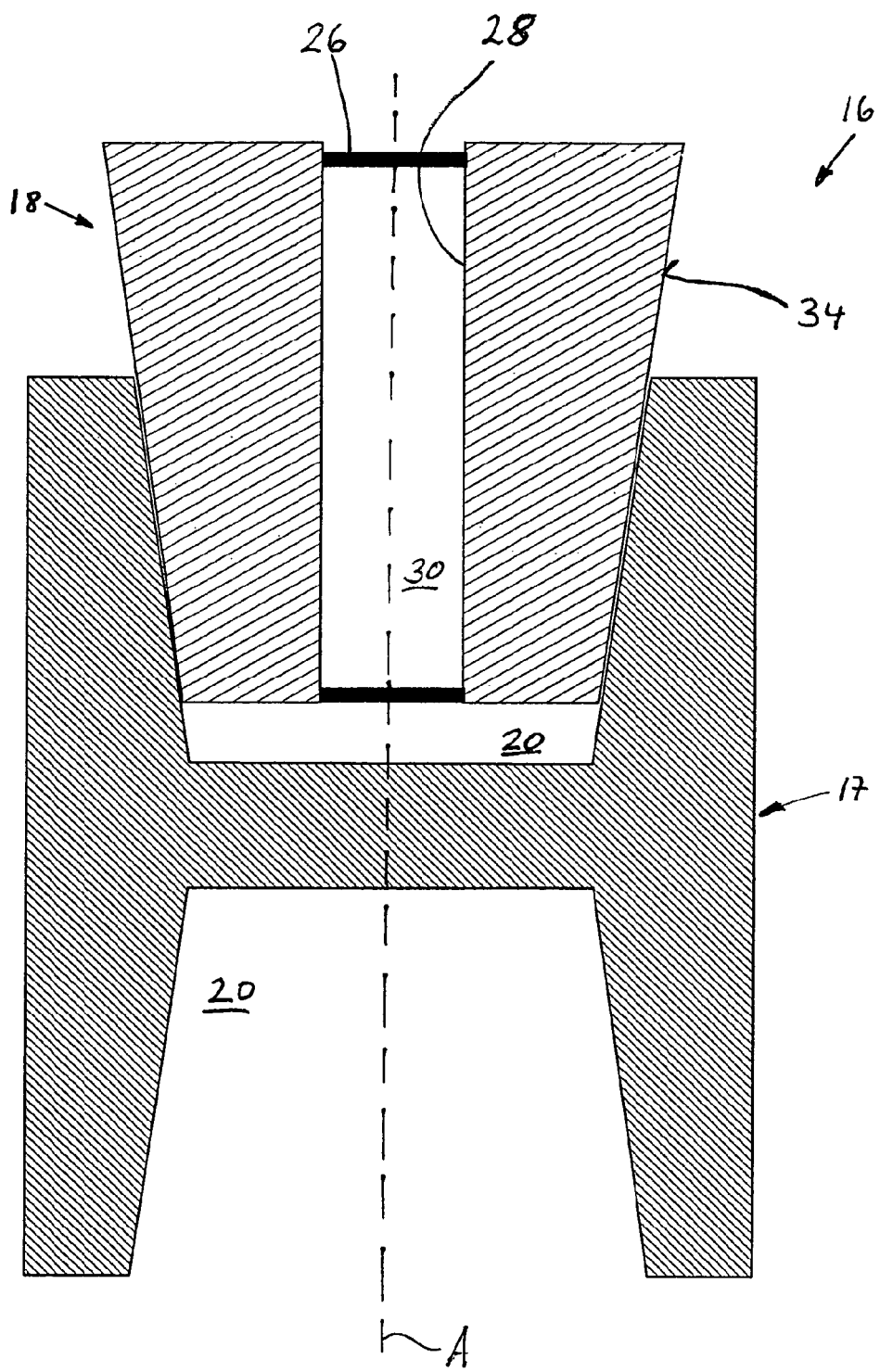
FIG. 8 is a diagrammatic sectional illustration of the rod holder of FIG. 7 taken along line VIII-VIII.

FIG. 7 shows a diagrammatic plan view of rod holder 16 for circular thin silicon rods 13 according to another alternative, and FIG. 8 shows a diagrammatic sectional illustration of this rod holder 16 taken along line VIII-VIII in FIG. 7 with the thin silicon rod not being shown in this illustration. The thin silicon rod 16 is provided for circular thin silicon rods 13 and may be inserted in the same manner as described above.

As is best seen in FIG. 8, the rod holder 16 comprises a base element 17 and a clamping element 18 corresponding to the ones described above. The base element 17 has a cylindrical form and comprises a conical recess 20 at each of its lower and upper ends. The recesses are mirror symmetric with respect to the center plane of the base element, so that the base element 17 essentially forms an H-shape in cross-section. The base element 17 is rotationally symmetric with respect to a longitudinal axis A of the rod holder 16.

The lower recess 20 is used for receiving a contact element on the reactor side by which the base element 17 is received in the reactor and via which electric contacting of the base element takes place. A corresponding support and an electric contacting in the reactor however may also be provided in another way, so that the lower recess 20 could also be omitted. The upper recess 20 is used for receiving the clamping element 18 as will be explained below.

The clamping element 18 consists of three separate contact elements 25, which are connected to each other via connection lands 26. As can be seen in the plan view according to FIG. 7, the contact elements 25 are disposed at equal angular distances to each other via the connection lands 26 and each of the contact elements 25 extends radially towards the common center.

The surfaces 28 facing radially inwards (inner surfaces) of the contact elements 25 form a receiving space 30 for the thin silicon rod in between. As can be seen in the plan view of FIG. 7, the inner surfaces 28 of contact elements 25 are matched to the curvature of the thin silicon rod. In the direction of the longitudinal central axis A of the rod holder 16, the inner surfaces 28 are straight and extend parallel to the longitudinal central axis A.

The side surfaces 32 of the contact elements are oriented in acute angles in such a way, that the contact elements 25 increase in width in a radial direction, as can be seen in FIG. 7. However, in the direction of the longitudinal central axis A of the clamping element 16, the side surfaces are parallel. The radially outward facing surfaces 34 (outer surfaces) of the contact elements 25 are thus wider than the inner surfaces 28.

The outer surfaces 34 comprise a curvature matched to the recess 20, as can be seen in the plan view of FIG. 7. Further, the outer surfaces 34 are oriented in an acute angle with respect to the inner surfaces 28 in such a way, that the contact elements 25 taper towards the bottom, as can be seen in FIG. 8. The outer surfaces 34 comprise a slant corresponding to the slant of the tapering of the recess 20. A person skilled in the art will notice that the contact elements 25 are pushed towards each other in the direction of longitudinal central axis A when the clamping element 18 is pushed into the recess 20.

The connection lands 26 extend between adjacent contact elements 25, with one connection land provided in each upper and lower area of the contact elements 25. The connection lands are provided so as to keep the contact elements in a predetermined angular relation to each other. When the contact elements 25 are moved towards each other, the connection lands 26 deform and, if necessary, break at the predetermined breaking points. The connection lands thus primarily serve the purpose of keeping the contact elements 25 in a predetermined relation to each other before inserting the contact elements 25 into base body 17. During insertion this relation may be varied, which may be achieved by flexibility of the connection lands or by destroying the connection lands e.g. at a predetermined breaking point. The contact elements 25 and the connection lands 26 may be formed separately or integrally from the same or different materials. Although the connection lands 26 are shown in the illustration between the side surfaces 32 of the contact elements 25, it should be noted that also other connections may be provided permitting a relative movement between contact elements 25 when inserting contact elements 25 into the recess 20 but keeping the contact elements 25 in a predetermined relation to each other prior to insertion. In this way, for example a star-shaped connection element may be provided, extending between the inner surfaces 28 of the contact elements 25 and which simultaneously serves as a lower boundary for the receiving space 30 between the contact elements 25. It is also possible to completely forgo any connections between the contact elements 25. In order to simplify handling of the contact elements 25, in particular when they are not connected to each other, for example guidances for the contact elements 25 could be provided in the recess 20 in the base element 17. These guidances could be provided with a predetermined relation of angles so as to be able to receive and guide a single contact element.

It should be further noted that in the embodiment according to FIGS. 7 and 8, also more than three contact elements 25 may provided, for example four for thin silicon rods having a square cross-section. In this case the inner surfaces 28 of the contact elements 25 would be formed being plane and not curved. Generally it should be noted, that the inner surfaces 28 of the contact elements serving as contact surfaces may be matched to the contact surface of the thin silicon rod. The contact elements 25 and the base element 17 are made from an electrically conductive material, with at least the contact elements typically being made of graphite.

The invention was described above in detail with respect to preferred embodiments, without being limited to the specific embodiments. In particular a combination or exchange of elements of the different embodiments shall be encompassed. For example the embodiment according to FIGS. 7 and 8 may be used in combination with a clamping ring 9.

The invention claimed is:

1. Clamping and contacting device for mounting and electrically contacting thin silicon rods in silicon deposition reactors having a rod holder for receiving one end of a thin silicon rod having an outer surface, wherein the rod holder includes at least three contact elements disposed around a receiving space for the thin silicon rod with each forming a contact surface facing towards a receiving space for electrically and mechanically contacting the thin silicon rod, the contact surfaces being concentric with the outer surface of the silicon rod, wherein the contact surfaces of adjacent contact elements are spaced apart.

2. Clamping and contacting device according to claim 1, wherein the contact surfaces each extend parallel to a longitudinal axis of the rod holder.

3. Clamping and contacting device according to claim 1, wherein the contact surfaces are stripe-shaped.

4. Clamping and contacting device according to claim 1, wherein the contact elements are movable relative to each other towards a receiving space.

5. Clamping and contacting device according to claim 1, wherein the rod holder includes a base element and a clamping element having the contact elements.

6. Clamping and contacting device according to claim 5, wherein the base element includes a conically tapered receptacle and the clamping element includes a correspondingly tapered contour.

7. Clamping and contacting device according to claim 6, wherein the tapering of the receptacle in the base element and the tapered contour of the clamping element are dimensioned such that a movement of the clamping element into the receptacle causes a movement of the contact elements towards each other so as to reduce the receiving space.

8. Clamping and contacting device according to claim 7, wherein the movement of the contact elements occurs perpendicular to their contact surfaces.

9. Clamping and contacting device according to claim 1, wherein the contact elements are equally spaced around the receiving space.

10. Clamping and contacting device according to claim 1, wherein the contact elements are separate elements connected to each other via connecting elements at least before being used.

11. Clamping and contacting device according to claim 10, wherein the connecting elements provided between the contact elements are flexible so as to permit relative movement between the contact elements.

12. Clamping and contacting device according to claim 10, wherein the contact elements and the connection elements are integrally formed.

13. Clamping and contacting device according to claim 5, further comprising a clamping ring fixed to the base element in such a manner that a receptacle for the contact elements is formed between the clamping ring and the base element, the receptacle being dimensioned such that upon mounting the clamping ring to the base element the contact elements are moved relative to each other towards the receiving space.

14. Clamping and contacting device according to claim 13, wherein the clamping ring is threadably connectable to the base element or clampable with respect to the base element by means of a quick-release mechanism.

15. Clamping and contacting device according to claim 13, wherein the clamping ring has an aperture with a tapered inner wall matched to a tapered contour of the contact elements.

16. Clamping and contacting device according to claim 1, wherein the contact elements contact the thin silicon rod received in the rod holder at its lower end via contact surfaces in a form-fitted manner.

17. Clamping and contacting device according to claim 10, wherein the connecting elements provided between the contact elements include predetermined breaking points so as to permit relative movement between the contact elements.

18. Clamping and contacting device according to claim 1, wherein the contact elements contact the thin silicon rod received in the rod holder at its lower end via contact surfaces in a force-fitted manner.

19. Clamping and contacting device for mounting and electrically contacting thin silicon rods in silicon deposition reactors comprising:
   a rod holder for receiving one end of a thin silicon rod having an outer surface, the rod holder including a base element for receiving and fixing a separate clamping element having at least three contact elements disposed at equal angular distances,
   wherein the rod holder includes at least three contact elements disposed around a receiving space for the thin silicon rod with each forming a contact surface facing towards a receiving space for electrically and mechanically contacting the thin silicon rod, wherein the contact surfaces of adjacent contact elements are spaced apart and have a contour matched to the curvature or to the outer surface of the thin rod.

\* \* \* \* \*